(12) United States Patent
Cheng et al.

(10) Patent No.: US 10,784,324 B2
(45) Date of Patent: Sep. 22, 2020

(54) ORGANIC LIGHT-EMITTING DIODE ARRAY SUBSTRATE, MANUFACTURING METHOD THEREOF AND DISPLAY APPARATUS

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/757,250

(22) PCT Filed: Aug. 7, 2017

(86) PCT No.: PCT/CN2017/096206
§ 371 (c)(1),
(2) Date: Mar. 2, 2018

(87) PCT Pub. No.: WO2018/133385
PCT Pub. Date: Jul. 26, 2018

(65) Prior Publication Data
US 2019/0067396 A1    Feb. 28, 2019

(30) Foreign Application Priority Data
Jan. 19, 2017   (CN) .......................... 2017 1 0043335

(51) Int. Cl.
*H01L 51/52*     (2006.01)
*H01L 27/32*     (2006.01)
(Continued)

(52) U.S. Cl.
CPC ...... *H01L 27/3248* (2013.01); *H01L 27/1255* (2013.01); *H01L 27/3279* (2013.01);
(Continued)

(58) Field of Classification Search
CPC ...... H01L 27/3248; H01L 21/77; H01L 27/12; H01L 27/3279; H01L 51/5212; H01L 51/5228; H01L 51/56
(Continued)

(56) References Cited

U.S. PATENT DOCUMENTS 8,963,137 B2   2/2015 Lee et al.
9,263,509 B2 * 2/2016 Lee ..................... H01L 51/5206
(Continued)

FOREIGN PATENT DOCUMENTS

CN          103066212 A       4/2013
CN          103715205 A       4/2014
(Continued)

OTHER PUBLICATIONS

International Search Report of PCT/CN2017/096206 in Chinese, dated Nov. 10, 2017 with English translation.
(Continued)

*Primary Examiner* — Cuong Q Nguyen
(74) *Attorney, Agent, or Firm* — Collard & Roe, P.C.

(57) ABSTRACT

An organic light-emitting diode (OLED) array substrate, a method for manufacturing an organic light-emitting diode (OLED) array substrate and a display apparatus are provided, and the OLED array substrate includes: a base substrate; a driving transistor, a first electrode, a second electrode, an organic material functional layer, and an auxiliary electrode connected to the second electrode disposed on the base substrate; and the driving transistor includes a gate electrode, a source electrode and a drain electrode, and the first electrode is electrically connected with the source electrode or the drain electrode; the auxiliary electrode is disposed in a same layer as at least one of the first electrode, the gate electrode, and the drain electrode.

18 Claims, 5 Drawing Sheets

(51) Int. Cl.
*H01L 51/56* (2006.01)
*H01L 27/12* (2006.01)

(52) U.S. Cl.
CPC ...... *H01L 51/5212* (2013.01); *H01L 51/5228* (2013.01); *H01L 51/56* (2013.01)

(58) Field of Classification Search
USPC .......................................................... 257/40
See application file for complete search history.

(56) References Cited

U.S. PATENT DOCUMENTS

| | | | |
|---|---|---|---|
| 9,761,644 B2 | 9/2017 | Jeong et al. | |
| 9,831,300 B2* | 11/2017 | Bae | H01L 51/524 |
| 9,905,814 B2* | 2/2018 | Kuji | H01L 51/56 |
| 10,217,764 B2* | 2/2019 | Nakamura | H01L 51/5234 |
| 10,374,027 B2 | 8/2019 | Choi | |
| 2013/0056784 A1 | 3/2013 | Lee et al. | |
| 2013/0099218 A1* | 4/2013 | Lee | H01L 51/5203 |
| | | | 257/40 |
| 2014/0183502 A1* | 7/2014 | Song | H01L 27/3246 |
| | | | 257/40 |
| 2014/0346448 A1* | 11/2014 | You | H01L 51/5228 |
| | | | 257/40 |
| 2015/0034913 A1* | 2/2015 | Yoon | H01L 51/5203 |
| | | | 257/40 |
| 2016/0013436 A1* | 1/2016 | Im | H01L 51/5206 |
| | | | 257/40 |
| 2016/0035803 A1* | 2/2016 | Kim | H01L 27/3246 |
| | | | 257/40 |
| 2016/0079325 A1* | 3/2016 | Lee | H01L 27/3246 |
| | | | 257/40 |
| 2016/0079334 A1* | 3/2016 | Lee | H01L 27/3258 |
| | | | 257/40 |
| 2016/0190505 A1* | 6/2016 | Koo | H01L 51/5228 |
| | | | 257/40 |
| 2017/0033166 A1* | 2/2017 | Shim | H01L 51/5228 |

FOREIGN PATENT DOCUMENTS

| | | |
|---|---|---|
| CN | 104091894 A | 10/2014 |
| CN | 104659055 A | 5/2015 |
| CN | 104716091 A | 6/2015 |
| KR | 2003-0024095 A | 3/2003 |
| KR | 10-2013-0025806 A | 3/2013 |
| KR | 10-2013-0031101 A | 3/2013 |

OTHER PUBLICATIONS

Notice of Transmittal of the International Search Report of PCT/CN2017/096206 in Chinese, dated Nov. 10, 2017.
Written Opinion of the International Searching Authority of PCT/CN2017/096206 in Chinese, dated Nov. 10, 2017 with English translation.
Korean Office Action in Korean Application No. 10-2018-7009009, dated Sep. 25, 2019 with English translation.
Chinese Office Action in Chinese Application No. 201710043335.5, dated Apr. 1, 2020 with English translation.
Korean Notice of Allowance in Korean Application No. 10-2018-7009009 dated Mar. 2, 2020 with English Translation.

* cited by examiner

ORGANIC LIGHT-EMITTING DIODE ARRAY SUBSTRATE, MANUFACTURING METHOD THEREOF AND DISPLAY APPARATUS

CROSS REFERENCE TO RELATED APPLICATIONS

This application is the National Stage of PCT/CN2017/096206 filed on Aug. 7, 2017, which claims priority under 35 U.S.C. § 119 of Chinese Application No. 201710043335.5 filed on Jan. 19, 2017, the disclosure of which is incorporated by reference.

TECHNICAL FIELD

Embodiments of the present disclosure relate to an organic light-emitting diode (OLED) array substrate, a method for manufacturing an organic light-emitting diode (OLED) array substrate and a display apparatus.

BACKGROUND

An organic light-emitting diode (OLED) display is a new generation of display, compared with a liquid crystal display, the organic light-emitting diode (OLED) displays have advantages such as self luminescence, rapid response, wide view angles, and capable to be used in a flexible display, a transparent display, a 3D display and so on.

The organic light-emitting diode (OLED) is composed of an anode, a cathode and an organic material function layer, the main working principle of the OLED is that the organic material function layer is driven by an electric field formed by the anode and the cathode, then carriers are injected and recombined to emit light.

SUMMARY

At least one embodiment of the present disclosure provides an organic light-emitting diode (OLED) array substrate, and the organic light-emitting diode (OLED) array substrate includes: a base substrate; a driving transistor, a first electrode, a second electrode, an organic material functional layer, and an auxiliary electrode connected to the second electrode disposed on the base substrate; and the organic material functional layer is located between the first electrode and the second electrode; the driving transistor includes a gate electrode, a source electrode and a drain electrode, and the first electrode is electrically connected with the source electrode or the drain electrode; the auxiliary electrode is disposed in a same layer as at least one of the first electrode, the gate electrode, and the drain electrode.

For example, in the OLED array substrate provided by at least one embodiment of the present disclosure, the auxiliary electrode is disposed in a same layer as both the first electrode and the gate electrode.

For example, in the OLED array substrate provided by at least one embodiment of the present disclosure, the auxiliary electrode is disposed in a same layer as both the first electrode and the drain electrode.

For example, in the OLED array substrate provided by at least one embodiment of the present disclosure, the auxiliary electrode is disposed in a same layer as both the gate electrode and the drain electrode.

For example, in the OLED array substrate provided by at least one embodiment of the present disclosure, the auxiliary electrode is disposed in a same layer as all of the first electrode, the gate electrode and the drain electrode.

For example, the OLED array substrate provided by at least one embodiment of the present disclosure, further includes an insulating structure disposed between the second electrode and the auxiliary electrode, in which a plurality of via holes are disposed in the insulating structure, and the second electrode is connected to the auxiliary electrode through the plurality of via holes.

For example, in the OLED array substrate provided by at least one embodiment of the present disclosure, an orthographic projection of the second electrode on the base substrate is at least partially overlapped with an orthographic projection of the auxiliary electrode on the base substrate.

For example, in the OLED array substrate provided by at least one embodiment of the present disclosure, the first electrode includes a first metal conductive layer, a transparent conductive layer or a stacked structure of the first metal conductive layer and the transparent conductive layer, and the second electrode includes a second metal conductive layer.

For example, in the OLED array substrate provided by at least one embodiment of the present disclosure, a thickness of the first metal conductive layer is from 80 nm to 120 nm, a thickness of the second metal conductive layer is from 3 nm to 20 nm.

For example, in the OLED array substrate provided by at least one embodiment of the present disclosure, the first electrode is an anode, the second electrode is a cathode. For example, the first electrode is a cathode and the second electrode is an anode.

For example, the OLED array substrate provided by at least one embodiment of the present disclosure further includes a light-blocking component, the light-blocking component and the first electrode are arranged in a same layer and made of a same material, and the light-blocking component and the auxiliary electrode are an integral structure.

For example, the OLED array substrate provided by at least one embodiment of the present disclosure further includes a light-blocking component, the light-blocking component and the first electrode are arranged in a same layer and made of a same material, and the light-blocking component and the auxiliary electrode are spaced apart from each other.

For example, in the OLED array substrate provided by at least one embodiment of the present disclosure, an orthogonal projection of the light-blocking component on the base substrate is overlapped with an orthographic projection of the driving transistor on the base substrate.

For example, the OLED array substrate provided by at least one embodiment of the present disclosure further includes a switching transistor, in which an orthogonal projection of the light-blocking component on the base substrate is overlapped with an orthographic projection of the switching transistor on the base substrate.

For example, in the OLED array substrate provided by at least one embodiment of the present disclosure, the organic material functional layer includes a light-emitting layer, an electron injection layer, an electron transport layer, a hole injection layer and a hole transport layer.

For example, at least one embodiment of the present disclosure further provides a display apparatus, and the display apparatus includes any one of the OLED array substrates described above.

At least one embodiment of the present disclosure further provides a method for manufacturing an organic light-emitting diode (OLED) array substrate, and the method includes: providing a base substrate; forming a driving transistor, a first electrode, an organic material functional layer, a second electrode and an auxiliary electrode on the base substrate; and the organic material functional layer is formed between the first electrode and the second electrode; the driving transistor includes a gate electrode, a source electrode and a drain electrode, and the first electrode is electrically connected to the drain electrode; the auxiliary electrode is formed in a same patterning process as at least one of the first electrode, the gate electrode, and the drain electrode.

For example, in the manufacturing method provided by at least one embodiment of the present disclosure, the auxiliary electrode is a double-layer structure, a first layer of the auxiliary electrode and the first electrode are prepared by a single mask plate and made of a same material; a second layer of the auxiliary electrode and the gate electrode are formed by a single mask plate and made of a same material.

For example, in the manufacturing method provided by at least one embodiment of the present disclosure, the auxiliary electrode is a double-layer structure, a first layer of the auxiliary electrode and the first electrode are prepared by a single mask plate and made of a same material; a second layer of the auxiliary electrode and the drain electrode are formed by a single mask plate and made of a same material.

For example, in the manufacturing method provided by at least one embodiment of the present disclosure, the auxiliary electrode is a double-layer structure, a first layer of the auxiliary electrode and the gate electrode are prepared by a single mask plate and made of a same material; a second layer of the auxiliary electrode and the drain electrode are formed by a single mask plate and made of a same material.

For example, in the manufacturing method provided by at least one embodiment of the present disclosure, the auxiliary electrode is a triple-layer structure, a first layer of the auxiliary electrode and the first electrode are prepared by a single mask plate and made of a same material; a second layer of the auxiliary electrode and the gate electrode are prepared by a single mask and made of a same material; a third layer of the auxiliary electrode and the drain electrode are prepared by a single mask plate and made of a same material.

For example, the manufacturing method provided by at least one embodiment of the present disclosure further includes forming an insulating structure between the second electrode and the auxiliary electrode; forming a plurality of via holes in the insulating structure; wherein the second electrode is connected to the auxiliary electrode through the plurality of via holes.

For example, in the manufacturing method provided by at least one embodiment of the present disclosure, the first electrode includes a first metal conductive layer, a transparent conductive layer or a stacked structure of the first metal conductive layer and the transparent conductive layer, and the second electrode includes a second metal conductive layer.

For example, in the manufacturing method provided by at least one embodiment of the present disclosure, a thickness of the first metal conductive layer is from 80 nm to 120 nm, a thickness of the second metal conductive layer is from 3 nm to 20 nm.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

Figure 1:
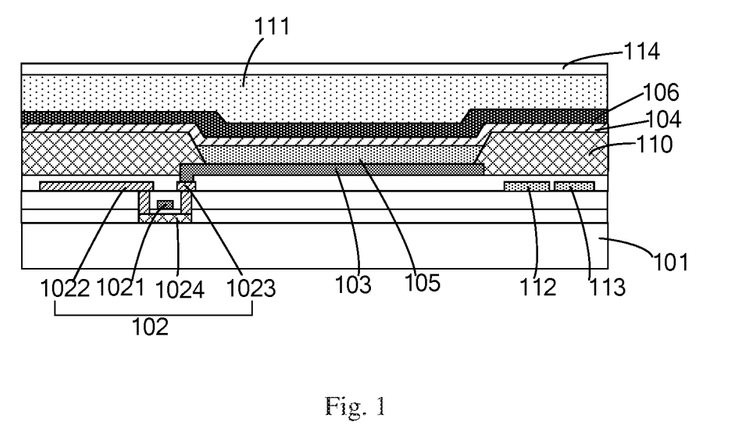
FIG. 1 is a schematic sectional view of an organic light-emitting diode (OLED) array substrate.

FIG. 1 is a schematic sectional view of an organic light-emitting diode (OLED) array substrate, as illustrated in FIG. 1, the OLED array substrate includes: a base substrate 101; a driving transistor 102, a first electrode 103 and a second electrode 104 disposed on the base substrate 101, an organic material functional layer 105 located between the first electrode 103 and the second electrode 104, and an auxiliary electrode 106 disposed on the second electrode 104, the driving transistor 102 includes a gate electrode 1021, a source electrode 1022, a drain electrode 1023 and an active layer 1024, and the first electrode 103 is electrically connected with the source electrode 1022 or the drain electrode 1023, in FIG. 1, the first electrode 103 is electrically connected with the drain electrode 1023.

The second electrode 104 of the OLED array substrate is generally made of metallic silver with a thinner thickness, and the first electrode 103 is generally made of indium tin oxide (ITO). The resistivity of the metal silver with a thinner thickness and the resistivity of the ITO is high, and especially for the second electrode 104 with a large area, the second electrode 104 made of the thin metal silver has a higher resistivity, and the voltage drop (IR drop) is larger, in this way, the actual driving voltage of the OLED array substrate is greatly different from the power voltage, in a large-size OLED display device, a large area of uneven brightness phenomenon is occurred, which affects the display effect. As illustrated in FIG. 1, the auxiliary electrode 106 formed on the second electrode 104 reduces the resistance of the second electrode 104. However, the auxiliary electrode 106 formed on the second electrode 104 increases the process steps, in this way, the production cost is increased. In addition, if the material of the auxiliary electrode is a metal material, the light transmittance of the second electrode is reduced; if the material of the auxiliary electrode is a metal oxide semiconductor with a higher resistivity, the effect of reducing the resistance of the second electrode is not obvious.

At least one embodiment of the present disclosure provides an organic light-emitting diode (OLED) array substrate, and the organic light-emitting diode (OLED) array substrate includes: a base substrate; a driving transistor, a first electrode, a second electrode, an organic material functional layer, and an auxiliary electrode connected in parallel with the second electrode disposed on the base substrate; and the organic material functional layer is located between the first electrode and the second electrode; the driving transistor includes a gate electrode, a source electrode and a drain electrode, and the first electrode is electrically connected with the source electrode or the drain electrode; the auxiliary electrode is disposed in a same layer as at least one of the first electrode, the gate electrode, and the drain electrode.

In the embodiment of the present disclosure, the auxiliary electrode is disposed in a same layer as at least one of the first electrode, the gate electrode and the drain electrode, so that the auxiliary electrode is formed in a step that the first electrode, the gate electrode and/or the drain electrode of the OLED array substrate is formed. The auxiliary electrode is connected in parallel with the second electrode through the plurality of via holes to reduce the resistance of the second electrode without increasing the process steps. The auxiliary electrode may include a double-layer stacked structure of a metal conductive material and a transparent conductive material; if the auxiliary electrode is extended and blocks the driving transistor and the switching transistor, it is also possible to prevent external light from irradiating on the driving transistor and the switching transistor, so that a leakage current phenomenon is avoided.

Figure 2:
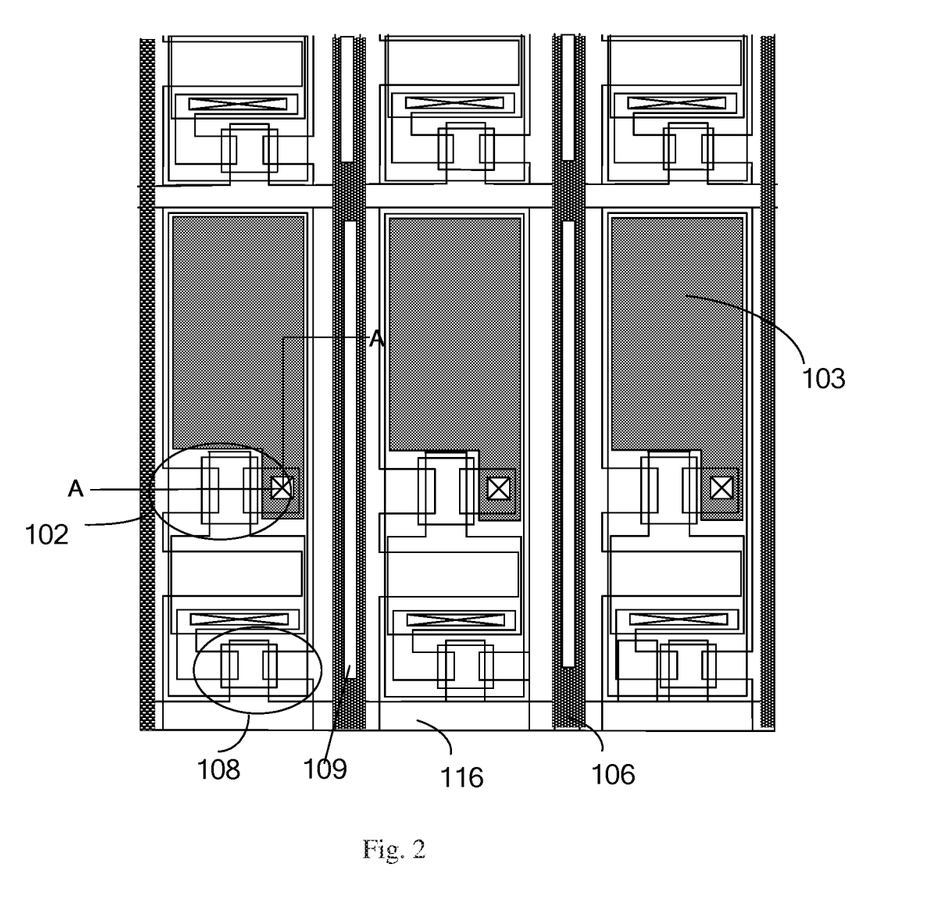
FIG. 2 is a schematic view of a planar structure of an OLED array substrate provided by an embodiment of the present disclosure.
Figure 3:
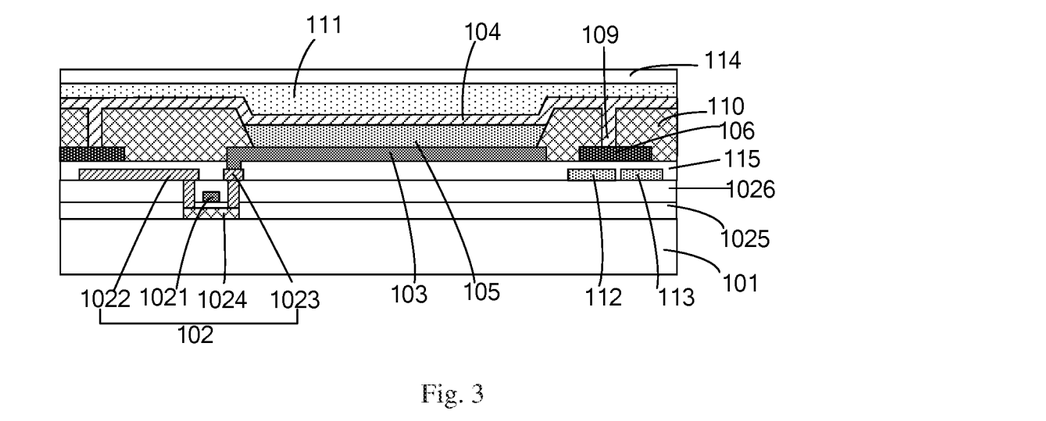
FIG. 3 is a schematic sectional view of the OLED array substrate shown in FIG. 2.

At least one embodiment of the present disclosure provides an organic light-emitting diode (OLED) array substrate, for example, FIG. 2 is a schematic view of a planar structure of an OLED array substrate provided by an embodiment of the present disclosure, FIG. 3 is a schematic sectional view of the OLED array substrate shown in FIG. 2. As illustrated in FIG. 2 and FIG. 3, the organic light-emitting diode (OLED) array substrate includes: a base substrate 101; a driving transistor 102, a first electrode 103, a second electrode 104, an organic material functional layer 105, and an auxiliary electrode 106 connected to the second electrode 104 disposed on the base substrate 101; and the organic material functional layer 105 is located between the first electrode 103 and the second electrode 104; the driving transistor 102 includes a gate electrode 1021, a source electrode 1022 and a drain electrode 1023, and the first electrode 103 is electrically connected with the source electrode 1022 or the drain electrode 1023; the auxiliary electrode 106 is disposed in a same layer as at least one of the first electrode 103, the gate electrode 1021, and the drain electrode 1023. For example, in FIG. 3, the auxiliary electrode 106 is disposed in a same layer as the first electrode 103.

It should be noted that, "disposed in a same layer" means that the auxiliary electrode 106 is formed in a same patterning process step as at least one of the first electrode 103, the gate electrode 1021 and the drain electrode 1023, the auxiliary electrode 106 and the electrode provided in the same layer as the auxiliary electrode 106 are made of a same material.

For example, the second electrode 104 and the auxiliary electrode 106 are connected in parallel. Hereinafter, the second electrode 104 and the auxiliary electrode 106 connected in parallel are taken for example.

For example, the OLED array substrate includes a display region and a peripheral region outside the display region. The display region is also referred to as an AA (Active Area), and the display region is generally used for displaying. The peripheral region may be used for arranging a driving circuit, packaging a display panel, and the like. For example, in the peripheral region, the second electrode 104 is electrically connected with the auxiliary electrode 106, and in the display region, the second electrode 104 is electrically connected with the auxiliary electrode 106, in this way, the second electrode 104 and the auxiliary electrode 106 are connected at both ends respectively to form a parallel circuit, or both ends that the second electrode 104 and the auxiliary electrode 106 connected to each other are located in the display region. In a case that the second electrode 104 receives a voltage signal and transmits the voltage signal, and the voltage signal reaches the auxiliary electrode 106 that electrically connected to the second electrode, the auxiliary electrode transmits the voltage signal simultaneously with the second electrode 104 as a branch of the voltage signal, which is equivalent to the second electrode 104 and the auxiliary electrode 106 forming the parallel circuit, in this way, the resistance in the process of electrical signal transmission is reduced; or the auxiliary electrode receives the voltage signal firstly, in a case that the voltage signal reaches the second electrode 104 electrically connected to the auxiliary electrode 106, the second electrode 104 as a branch for transmitting the voltage signal simultaneously with the auxiliary electrode 106; or the second electrode 104 and the auxiliary electrode 106 receives the voltage signal simultaneously, the second electrode 104 and the auxiliary electrode 106 transmit the voltage signal simultaneously as two branches.

For example, as illustrated in FIG. 2 and FIG. 3, the OLED array substrate further includes a power line 113 disposed on the base substrate 101, a data line 112, and a gate line 116 connected to the gate electrode 1021, a pixel structure is disposed in a region defined by intersecting the gate line 116 and the data line 112, for example, the pixel structure includes a switching transistor 108, the driving transistor 102, and an OLED device (including the first electrode 103, the second electrode 104 and the organic material functional layer 105), and the switching transistor 108 is connected to the gate line 116 and the data line 112, the driving transistor 102 is connected to the switching transistor 108, the power line 113, and the OLED device.

For example, the OLED device further includes a pixel defining layer 110 located between the first electrode 103 and the second electrode 104, and the pixel defining layer 110 is used for isolating two sub-pixel units adjacent to each other.

For example, the driving transistor shown in FIG. 3 is a top-gate type structure, it can be seen from FIG. 2 and FIG. 3, an active layer 1024 is further disposed on the base substrate 101. A gate insulating layer 1025, the gate electrode 1021 and a first insulating layer 1026 are formed on the active layer 1024 in turn. The source electrode 1022 and the drain electrode 1022 are formed on the first insulating layer 1026. The source electrode 1022 and the drain electrode 1023 are electrically connected to the active layer 1024 respectively. A second insulating layer 115 is formed on the source electrode 1022 and the drain electrode 1023, and the first electrode 103 and the auxiliary electrode 106 are formed on the second insulating layer 115. The first electrode 103 and the auxiliary electrode 106 are disposed in a same layer and formed in a same process step without additional process steps for preparing the auxiliary electrode, which saves process steps and the production cost is also reduced.

For example, the OLED array substrate provided by the embodiment of the present disclosure further includes an insulating structure disposed between the second electrode 104 and the auxiliary electrode 106, it should be noted that, the "insulating structure" refers to a layer structure having an insulating function provided between the second electrode 104 and the auxiliary electrode 106. A plurality of via holes are disposed in the insulating structure, and the second electrode 104 is connected to the auxiliary electrode 106 through the plurality of via holes, so that the second electrode 104 and the auxiliary electrode 106 are connected in parallel.

For example, in FIG. 3, the pixel defining layer 110 is made of an organic insulating material (for example, an acrylic resin) or an inorganic insulating material (for example, silicon nitride $SiN_x$ or silicon oxide $SiO_x$), the pixel defining layer 110 has an insulating property. In FIG. 3, the pixel defining layer 110 may be considered as the insulating structure disposed between the second electrode 104 and the auxiliary electrode 106. A plurality of via holes 109 are disposed in the pixel defining layer 110, and the second electrode 104 is connected with the auxiliary electrode 106 in parallel through the plurality of via holes 109.

In addition, by connecting the second electrode 104 and the auxiliary electrode 106 in parallel through the plurality of via holes 109, the thickness of the second electrode 104 is increased, which is equivalent to increasing the cross-sectional area of the second electrode 104, and further the resistance of the second electrode 104 is reduced.

For example, an orthographic projection of the second electrode 104 on the base substrate 101 is at least partially overlapped with an orthographic projection of the auxiliary electrode 106 on the base substrate 101, which facilitates for forming via holes in the insulating structure to electrically connect the second electrode 104 with the auxiliary electrode.

For example, the first electrode 103 includes a first metal conductive layer, a transparent conductive layer or a stacked structure of the first metal conductive layer and the transparent conductive layer.

For example, the first electrode 103 is made of a transparent conductive material, and the transparent conductive material includes indium tin oxide (ITO), indium zinc oxide (IZO), indium gallium oxide (IGO), zinc gallium oxide (GZO)), Indium oxide ($In_2O_3$), aluminum zinc oxide (AZO) and carbon nanotubes.

For example, the first electrode 103 is made of a metal conductive material, and the metal conductive material includes a single metal such as Cu, Cr, Mo, Au, Ag and Pt metal, or an alloy material formed of the above metals, for example, a copper chromium alloy (CuCr) or a chromium molybdenum alloy (CrMo).

For example, the first electrode 103 is a stacked structure formed by any combination of the above-mentioned transparent conductive material and the metal conductive material. For example, the first electrode 103 is a structure that the metal conductive material is sandwiched between two transparent conductive materials of ITO-Ag-ITO, ITO-Mo-IZO, ITO-Cr—$In_2O_3$, ITO-Cu—ZnO and ITO-Pt-IGO, or the first electrode 103 is a stacked double-layer structure made of the metal conductive material and the transparent conductive material of IZO-Mo, ITO-Cr, ZnO—Mg and ITO-Au. For example, the stacked structure formed of any combination of the transparent conductive material and the metal conductive material is not limited to the stacked double-layer structure and the stacked triple-layer structure.

It should be noted that, since the work function of the metal material or the work function of the alloy material for forming the first electrode is relatively low, the first electrode has a poor compatibility with the organic material functional layer in the OLED array substrate. The transparent conductive material formed on a side of the first metal layer close to the functional layer formed of the organic material improves the work function of the first metal, so that the first electrode is better matched to the functional layer formed of the organic material. In addition, the first electrode of the double-layer structure or the triple-layer structure has a lower resistance than the first electrode of the single-layer structure, and the resistance of the first electrode is lower, in this way, the resistance of the first electrode is reduced.

For example, a thickness of the first metal conductive layer is from 40 nm to 120 nm, for example, 40 nm, 50 nm, 60 nm, 70 nm, 80 nm, 90 nm, 100 nm, 110 nm or 120 nm.

For example, in the structure as illustrated in FIG. 3, the auxiliary electrode 106 and the first electrode are formed in a same layer. The material and the layer structure of the auxiliary electrode 106 may refer to the related descriptions of the first electrode described above, which is not limited herein.

For example, the second electrode includes a second metal conductive layer. The material of the second electrode 104 includes silver, magnesium, aluminum, lithium single metal, magnesium aluminum alloy (MgAl), lithium aluminum alloy (LiAl), and the like.

For example, a thickness of the second metal conductive layer is from 3 nm to 30 nm, for example, 5 nm, 10 nm, 15 nm, 20 nm, 25 nm or 30 nm.

Figure 4:
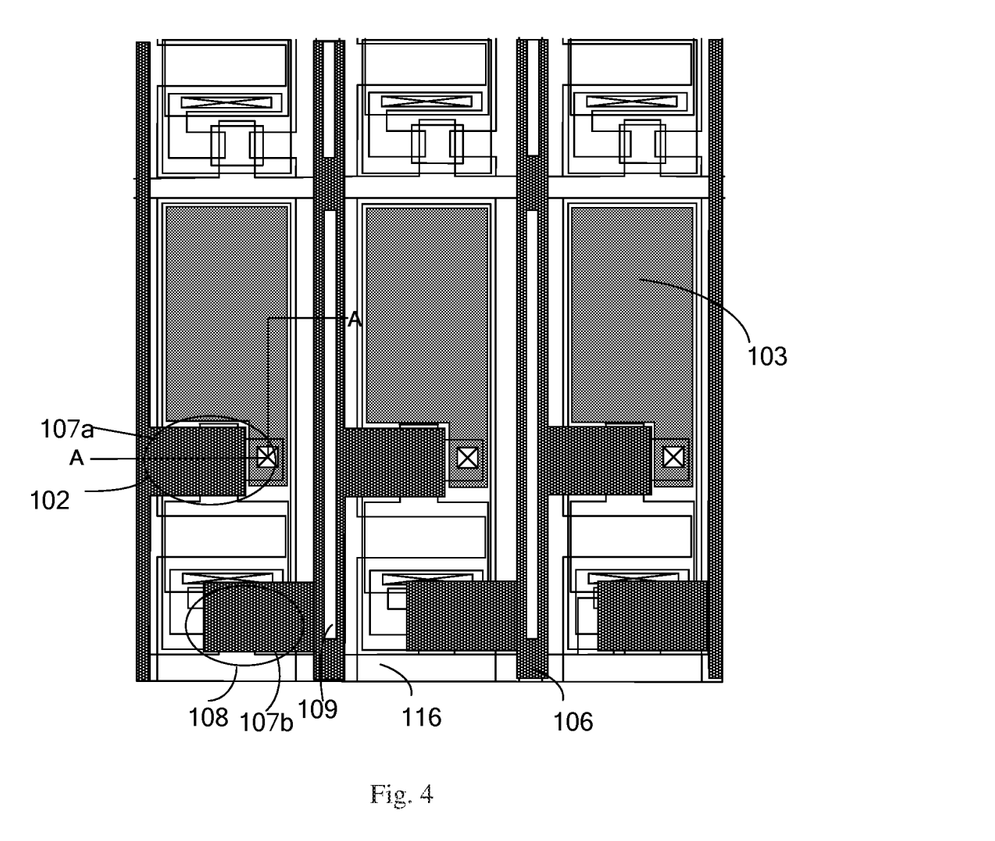
FIG. 4 is a schematic view of a planar structure of an OLED array substrate provided by another embodiment of the present disclosure.
Figure 5:
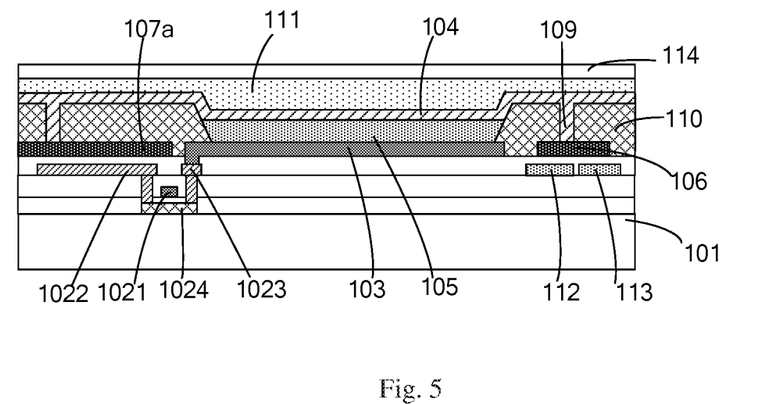
FIG. 5 is a schematic sectional view of the OLED array substrate shown in FIG. 4.

For example, FIG. 4 is a schematic view of a planar structure of an OLED array substrate provided by another embodiment of the present disclosure, FIG. 5 is a schematic sectional view of the OLED array substrate shown in FIG. 4, as illustrated in FIG. 4 and FIG. 5, the OLED array substrate further includes a light-blocking component 107a and 107b, and the light-blocking component 107a and 107b and the first electrode 103 are arranged in a same layer and made of a same material, and the light-blocking component 107a and 107b are connected with the auxiliary electrode 106, for example, the light-blocking component 107a and 107b and the auxiliary electrode 106 are an integral structure.

Figure 6:
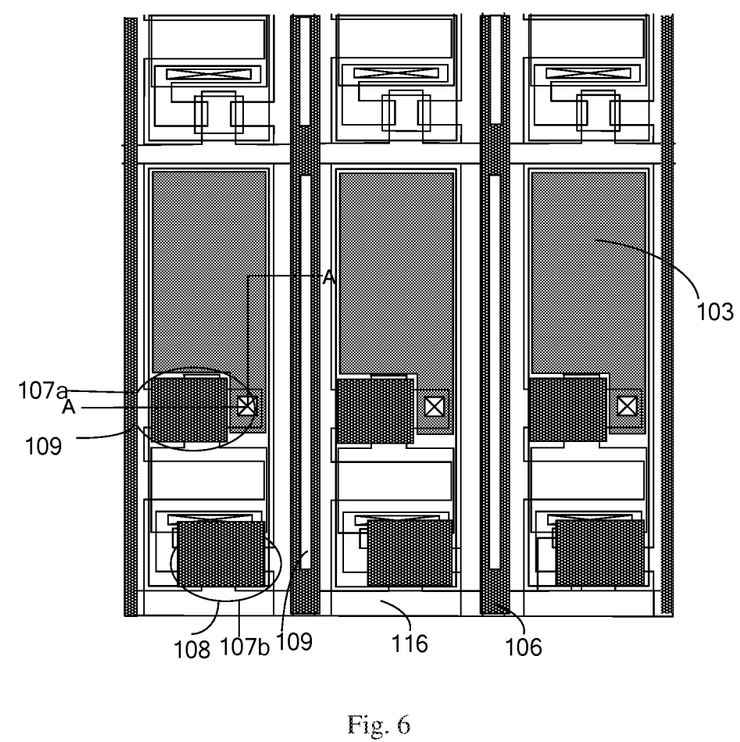
FIG. 6 is a schematic view of a planar structure of an OLED array substrate provided by still another embodiment of the present disclosure.
Figure 7:
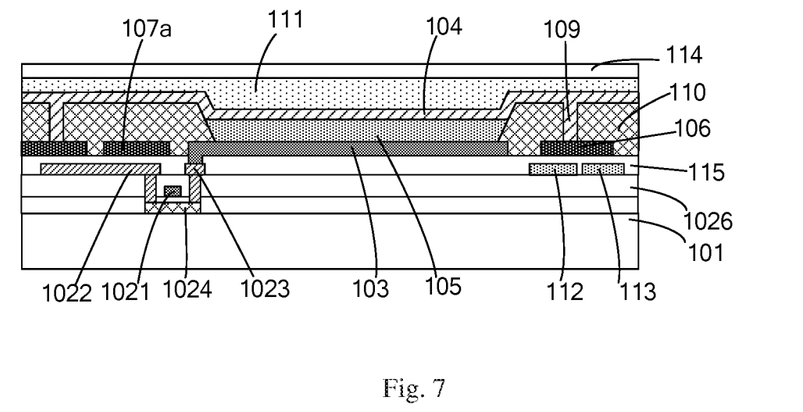
FIG. 7 is a schematic sectional view of the OLED array substrate shown in FIG. 6.

For example, FIG. 6 is a schematic view of a planar structure of an OLED array substrate provided by still another embodiment of the present disclosure, FIG. 7 is a schematic sectional view of the OLED array substrate shown in FIG. 6, as illustrated in FIG. 6 and FIG. 7, the light-blocking component 107a and 107b and the first electrode 103 are arranged in a same layer and made of a same material, and the light-blocking component 107a and 107b are disconnected with the auxiliary electrode 106, for example, the light-blocking component 107a and 107b and the auxiliary electrode 106 are spaced apart from each other.

For example, as illustrated in FIG. 4 and FIG. 6, an orthogonal projection of the light-blocking component 107a on the base substrate 101 is overlapped with an orthographic projection of the driving transistor 102 on the base substrate 101. Since the light-blocking component 107a is arranged in a same layer and made of a same material as the auxiliary electrode 106 and the first electrode 103. In a case that the first electrode is the stacked structure of the first metal conductive layer and the transparent conductive layer or the first electrode is just the first metal conductive layer, the light-blocking component 107a plays the role of blocking light, in this way, the light-blocking component 107a blocks light for the driving transistor 102.

For example, as illustrated in FIG. 4 and FIG. 6, the OLED array substrate further includes a switching transistor, an orthogonal projection of the light-blocking component 107b on the base substrate 101 is overlapped with an orthographic projection of the switching transistor on the base substrate 101. In a case that the first electrode is the stacked structure of the first metal conductive layer and the transparent conductive layer or the first electrode is just the first metal conductive layer, the light-blocking component 107a blocks light for the switching transistor 102.

In a case that the light-blocking component 107a and 107b are connected with the auxiliary electrode 106, the light-blocking component 107a disposed on the driving transistor and the light-blocking component 107b disposed on the switching transistor are made of the above mentioned stacked structure or the metal conductive material, in addition to shading the driving transistor and the switching transistor respectively, it is also possible to form a capacitor with the metal wire to absorb the changes of the electric field to prevent voltage fluctuations from affecting the stability of the voltage on the driving transistor and switching transistor.

For example, the driving transistor and the switching transistor provided in the embodiments of the present disclosure may be a bottom-gate structure, a top-gate structure, or a double-gates structure. For example, the driving transistor as illustrated in FIG. 3 is the top-gate structure. The top-gate structure and the bottom-gate structure are determined by the relative positions of the active layer and the gate electrode; that is, compared to the base substrate, in a case that the gate electrode is close to the base substrate, and the active layer is away from the base substrate, the thin film transistor is a bottom-gate type thin film transistor; in a case that the gate electrode is away from the base substrate, and the active layer is close to the base substrate, the thin film transistor is a top-gate type thin film transistor; the double-gate structure includes both the top gate electrode and the bottom gate electrode. Each of the structures of the driving transistor and the switching transistor of the bottom-gate structure and the double-gate structure may refer to the description of the top-gate structure described above, and detailed descriptions will be omitted herein.

For example, the first electrode is an anode, the second electrode is a cathode; or the first electrode is a cathode and the second electrode is an anode.

It should be noted that, the material and the structure of the first electrode and the second electrode are merely examples in the embodiments of the present disclosure, the first electrode and the second electrode may also be made of other materials, according to the difference of the material of the first electrode and the second electrode, the OLED array substrate is divided into a single-side light-emitting array substrate and a double-side light-emitting array substrate. In a case that the material of one of the anode and the cathode is opaque or semitransparent material, the array substrate is a single-side light-emitting type. In a case that the material of both the anode electrode and the cathode electrode is light-transmitting material and/or semitransparent material, the array substrate is double-side light-emitting array substrate.

For a single-side light-emitting OLED array substrate, according to the difference of the materials of the anode and the cathode, the OLED array substrate is divided into a top light-emitting type and bottom light-emitting type. In a case that the anode is close to the base substrate, and the cathode is away from the base substrate, and the material of the anode is a light-transmitting conductive material and the material of the cathode is an opaque conductive material, because light is emitted from the anode and then exited from the base substrate, it can be called as the bottom light-emitting type. In a case that the material of the anode is an opaque conductive material and the material of the cathode is a transparent or a translucent conductive material, the light exits from a side of the cathode away from the substrate, it is called as the top light-emitting type. The relative positions of the anode and the cathode in the above-mentioned two types may also be replaced, and detailed descriptions will be omitted herein. For example, the first electrode made of the material of the first metal conductive layer has a good reflectivity, the second electrode made of the material of the second metal conductive layer within the above thickness range has a good light transmittance, the above-mentioned OLED array substrate is a top light-emitting type.

For a double-side light-emitting array substrate, in a case that the anode is close to the base substrate, the cathode is away from the base substrate, and the materials of the anode and the cathode are both light-transmitting conductive materials and/or translucent materials, on one hand, since light exits from the anode and a main surface of the base substrate, and on the other hand, light exits from a side of the cathode away from the base substrate, the above-mentioned OLED array substrate is referred to as a double-side light-emitting type. Herein, the anode may be disposed away from the base substrate, and the cathode may be disposed close to the base substrate.

According to requirements, the materials of the first electrode and the second electrode may be selected to be suitable for the top light-emitting type, the bottom light-emitting type and the double-side light-emitting type, the material of the first electrode and the second electrode is not limited in the embodiments of the present disclosure, as long as the second electrode is connected with the auxiliary electrode in parallel and the resistance of the second electrode is reduced.

Figure 8:
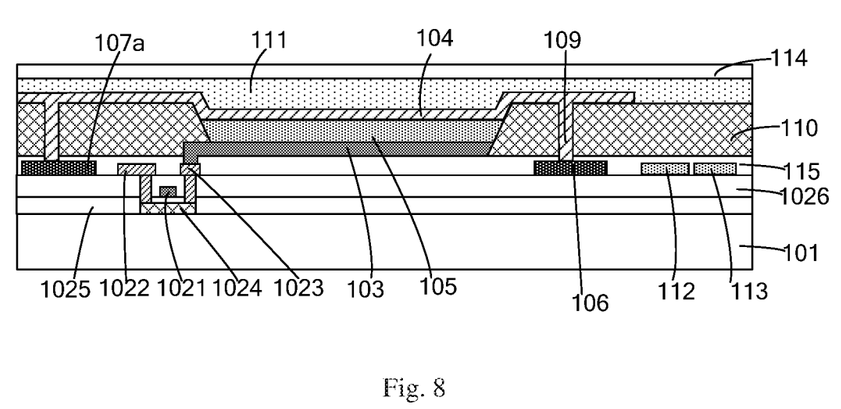
FIG. 8 is a schematic sectional view of an OLED array substrate provided by another embodiment of the present disclosure.

For example, FIG. 8 is a schematic sectional view of an OLED array substrate provided by another embodiment of the present disclosure. The auxiliary electrode 106 is arranged in a same layer and made of a same material as the source electrode 1022 and the drain electrode 1023. The material of the source electrode 105, the drain electrode 106, and the auxiliary electrode 106 formed in a same layer as the drain electrode 106 includes a metal material such as molybdenum, titanium, copper, and chromium, or an alloy material made of the above-mentioned metal, for example, copper molybdenum alloy (CuMo), copper titanium alloy (CuTi), copper molybdenum titanium alloy (CuMoTi), copper molybdenum tungsten alloy (CuMoW), copper molybdenum niobium alloy (CuMoNb), chromium molybdenum alloy (CrMo), chrome titanium alloy (CrTi), chromium molybdenum titanium alloy (CrMoTi) and the like. For example, in FIG. 8, the insulating structure includes the second insulating layer 115 and the pixel defining layer 110, the second electrode 104 is connected to the auxiliary electrode 106 through the via holes 109 disposed in the second insulating layer 115 and the pixel defining layer 110, so that a parallel structure is formed by the second electrode 104 and the auxiliary electrode 106.

Figure 9:
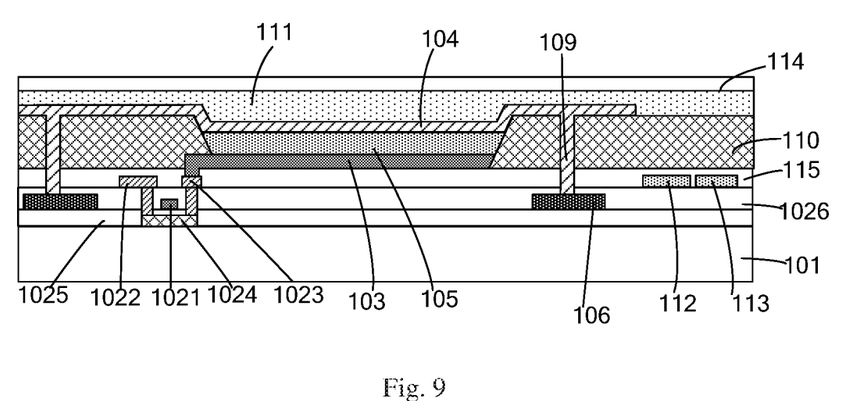
FIG. 9 is a schematic sectional view of an OLED array substrate provided by still another embodiment of the present disclosure.

For example, FIG. 9 is a schematic sectional view of an OLED array substrate provided by still another embodiment of the present disclosure. As illustrated in FIG. 9, the auxiliary electrode 106 is arranged in a same layer and made of a same material as the gate electrode 1021. The material of the gate electrode 105 and the auxiliary electrode 106 formed in a same layer as the gate electrode 106 includes a metal material such as molybdenum, titanium, copper, and chromium, or an alloy material made of the above-mentioned metal, for example, copper molybdenum alloy (CuMo), copper titanium alloy (CuTi), copper molybdenum titanium alloy (CuMoTi), copper molybdenum tungsten alloy (CuMoW), copper molybdenum niobium alloy (CuMoNb), chromium molybdenum alloy (CrMo), chrome titanium alloy (CrTi), chromium molybdenum titanium alloy (CrMoTi) and the like. For example, in FIG. 9, the insulating structure includes the first insulating layer 1026, the second insulating layer 115 and the pixel defining layer 110, the second electrode 104 is connected to the auxiliary electrode 106 through the via holes 109 disposed in the second insulating layer 115 and the pixel defining layer 110, so that a parallel connecting structure is formed by the second electrode 104 and the auxiliary electrode 106.

Figure 10:
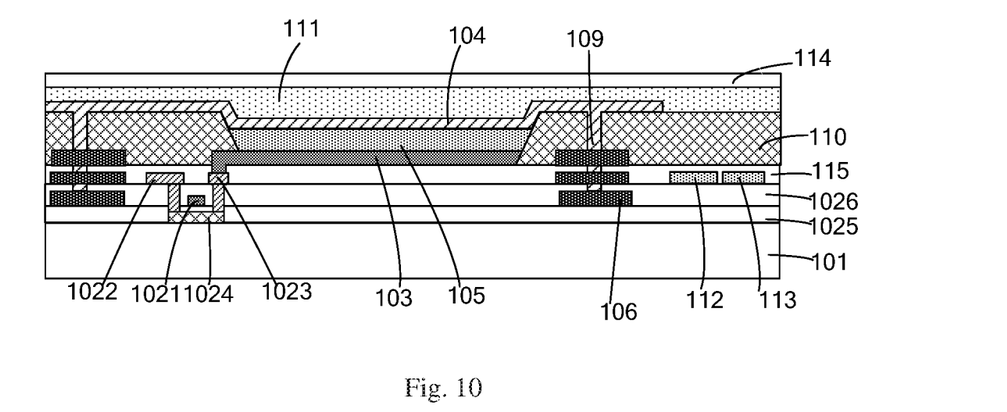
FIG. 10 is a schematic sectional view of an OLED array substrate provided by still another embodiment of the present disclosure.

For example, FIG. 10 is a schematic sectional view of an OLED array substrate provided by still another embodiment of the present disclosure. As illustrated in FIG. 10, the auxiliary electrode 106 is formed in a same layer as the gate electrode 1021, the source electrode 1022 and the first electrode 103, and the auxiliary electrode 106 is a triple-layer structure that three layers are connected to each other, in this way, the resistance of the second electrode is further reduced by connecting the second electrode 104 with the three layers of the conductive material in parallel simultaneously.

It should be noted that, the auxiliary electrode in the embodiment of the present disclosure may be a double-layer structure formed in a same layer as any two of the gate electrode 1021, the source electrode 1022 and the first electrode 103. For example, the auxiliary electrode is disposed in a same layer as both the first electrode and the gate electrode; for example, the auxiliary electrode is disposed in a same layer as both the first electrode and the drain electrode; for example, the auxiliary electrode is disposed in a same layer as both the gate electrode and the drain electrode, and detailed descriptions will be omitted herein.

For example, in a case that the auxiliary electrode is arranged in a same layer and made of a same material as the source electrode or the drain electrode, an extending direction of the auxiliary electrode is consistent with an extending direction of the data line; in a case that the auxiliary electrode is arranged in a same layer and made of a same material as the gate line or the gate electrode, the extending direction of the auxiliary electrode is consistent with an extending direction of the gate line; in a case that the auxiliary electrode is arranged in a same layer and made of a same material as the first electrode, the extending direction of the auxiliary electrode is consistent with the extending direction of the data line or consistent with the extending direction of the gate line. It should be noted that, in a case that the auxiliary electrode has a multi-layer structure, the different layers of the auxiliary electrode are connected through via holes in the region that the different layers of the auxiliary electrode are overlapped with each other.

For example, in the embodiment of the present disclosure, the material of the first insulating layer 1026 and the second insulating layer 115 may be the same as the material of the pixel defining layer 110, and may include an organic insulating material (for example, an acrylic resin) or an inorganic insulating material (for example, silicon nitride $SiN_x$ or silicon oxide $SiO_x$).

For example, the material of the gate insulating layer 1025 includes $SiN_x$, $SiO_x$, $Al_2O_3$, AlN, or other suitable material.

For example, the organic material functional layer 105 may include a hole transport layer, a light emitting layer, and an electron transport layer, in order to improve the efficiency of injecting the electrons and holes into the light-emitting layer, the organic material functional layer may further include an electron injection layer disposed between the cathode and the electron transport layer and a hole injection layer disposed between the anode and the hole transport layer and other organic functional layer.

Because water and oxygen make great impact on the performance of the cathode and the organic material functional layers, as illustrated in FIG. 3, a passivation layer 111 and an encapsulation layer 114 are disposed on the second electrode 104 of the OLED array substrate.

For example, the passivation layer 111 is made of silicon nitride ($SiN_x$), silicon oxide ($SiO_x$), acrylic resin and so on.

For example, the material of the encapsulation layer 114 includes a single film or a composite film formed of silicon nitride, silicon oxide, or photosensitive resin. For example, the photosensitive resin is a polyacrylic resin, a polyimide resin or a polyamide resin and so on.

The embodiments of the present disclosure further provide a display device, which includes any one of the above-mentioned OLED array substrates. Other structures in the display device may refer to the conventional design. For example, the display device is: a mobile phone, a tablet computer, a television, a display, a notebook computer, a digital picture frame, a navigation system and any other product or component having a display function.

Figure 11:
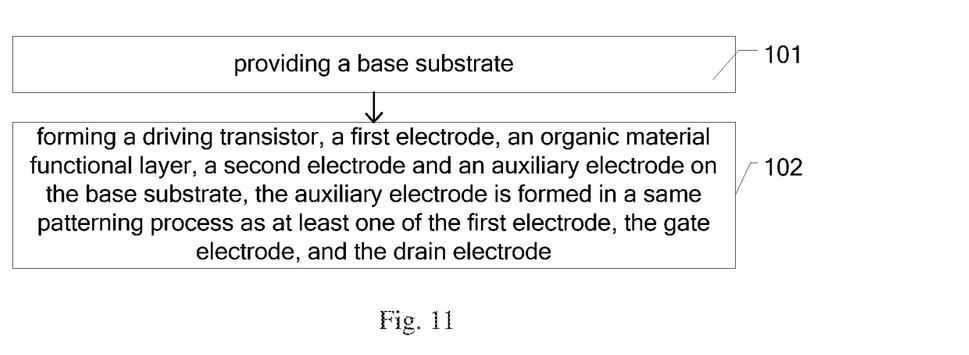
FIG. 11 is a flow diagram of a manufacturing method of an OLED array substrate provided by another embodiment of the present disclosure.

At least one embodiment of the present disclosure further provides a method for manufacturing an organic light-emitting diode (OLED) array substrate, for example, FIG. 11 is a flow diagram of a manufacturing method of an OLED array substrate provided by another embodiment of the present disclosure, as illustrated in FIG. 11, the manufacturing method includes the following operations:

Step 101: providing a base substrate.

For example, the base substrate is a glass substrate, a quartz substrate, a plastic substrate, or the like.

Step 102: forming a driving transistor, a first electrode, an organic material functional layer, a second electrode and an auxiliary electrode on the base substrate.

For example, the organic material functional layer is formed between the first electrode and the second electrode, the driving transistor includes a gate electrode, a source electrode and a drain electrode, the first electrode is electrically connected to the drain electrode, the auxiliary electrode is formed in a same patterning process as at least one of the first electrode, the gate electrode and the drain electrode.

It should be noted that, the "same patterning process" means that the auxiliary electrode formed in the same patterning process as at least one of the first electrode, the gate electrode and the drain electrode, the auxiliary electrode and the electrode disposed in the same layer as the auxiliary electrode are made of a same material.

The forming process of the OLED array substrate is illustrated by taking the driving transistor as a top-gate thin film transistor and the auxiliary electrode being formed in the same layer as the first electrode.

Step 201: providing the base substrate, and forming an active layer, a gate insulating layer, the gate electrode, a first insulating layer and a source/drain electrode layer (including the source electrode and the drain electrode) sequentially on the base substrate to form the driving transistor.

Step 202: forming a second insulating layer on the source/drain electrode layer (including the source electrode and the drain electrode) of the driving transistor.

Step 203: forming the first electrode and the auxiliary electrode of the OLED on the second insulating layer.

Step 204: forming a pixel defining layer on the first electrode of the OLED and forming a plurality of via holes in the pixel defining layer.

Step 205: forming the organic material functional layer on the pixel defining layer.

Step 206: forming the second electrode on the organic material functional layer, the second electrode being connected to the auxiliary electrode through the plurality of via holes formed in the pixel defining layer.

Step 207: forming a passivation layer and an encapsulation layer on the second electrode.

For example, in the above-mentioned steps, the insulating structure formed between the second electrode and the auxiliary electrode is the pixel defining layer, the plurality of via holes are formed in the insulating structure, and the second electrode is connected to the auxiliary electrode through the plurality of via holes.

For example, the second electrode connected with the auxiliary electrode in parallel through the plurality of via holes may further increase the thickness of the second electrode, which is equivalent to increasing the cross-sectional area of the second electrode and further reducing the resistance of the second electrode.

For example, in the peripheral region, the second electrode is electrically connected with the auxiliary electrode; in the display region, the second electrode is electrically connected with the auxiliary electrode through the plurality of via holes, in this way, the second electrode and the auxiliary electrode are respectively connected at both ends to form a parallel circuit, or both ends that the second electrode and the auxiliary electrode are connected to each other are located in the display region. In a case that the second electrode receives the voltage signal and transmits the voltage signal, and in a case that the voltage signal reaches the auxiliary electrode electrically connected to the second electrode, the auxiliary electrode transmits the voltage signal simultaneously with the second electrode as a branch for transmitting the voltage signal. This is equivalent to the second electrode and the auxiliary electrode forming the parallel circuit, and the resistance in the electrical signal transmission process is reduced. Or, the auxiliary electrode receives the voltage signal firstly, in a case that the voltage signal reaches the second electrode which is electrically connected to the auxiliary electrode, the second electrode transmits the voltage signal simultaneously with the auxiliary electrode as a branch for transmitting the voltage signal. Still alternatively, the second electrode and the auxiliary electrode receive the voltage signal simultaneously, and the second electrode and the auxiliary electrode transmit the voltage signal as the two branches simultaneously.

For example, the first electrode includes a first metal conductive layer, a transparent conductive layer or a stacked structure of the first metal conductive layer and the transparent conductive layer.

For example, the first electrode is made of a transparent conductive material, and the transparent conductive material includes indium tin oxide (ITO), indium zinc oxide (IZO), indium gallium oxide (IGO), zinc gallium oxide (GZO)), Indium oxide (In2O3), aluminum zinc oxide (AZO) and carbon nanotubes.

For example, the first electrode is made of a metal conductive material, and the metal conductive material includes a single metal such as Cu, Cr, Mo, Au, Ag and Pt A metal, or an alloy material formed of the above metals, for example, a copper chromium alloy (CuCr) or a chromium molybdenum alloy (CrMo).

For example, the first electrode is a stacked structure formed by any combination of the above transparent conductive material and the above metal conductive material. For example, the first electrode is a structure that the metal conductive material is sandwiched between two transparent conductive materials of ITO-Ag-ITO, ITO-Mo-IZO, ITO-Cr—In2O3, ITO-Cu—ZnO and ITO-Pt-IGO, or the first electrode is a stacked double-layer structure made of the metal conductive material and the transparent conductive material of IZO-Mo, ITO-Cr, ZnO—Mg and ITO-Au. For example, the stacked structure formed of any combination of the transparent conductive material and the metal conductive material is not limited to the stacked double-layer structure and the stacked triple-layer structure.

It should be noted that, since the work function of the metal material or the work function of the alloy material for forming the first electrode is relatively low, the first electrode has a poor compatibility with the organic material functional layer in the OLED array substrate. The transparent conductive material formed on a side of the first metal layer close to the organic material functional layer improves the work function of the first metal, so that the first electrode is better matched to the organic material functional layer. In addition, the first electrode of the double-layer structure or the triple-layer structure has a lower resistance than the first electrode of the single-layer structure, and the resistance of the first electrode is lower, in this way, the resistance of the first electrode is reduced.

For example, a thickness of the first metal conductive layer is from 40 nm to 120 nm, for example, 40 nm, 50 nm, 60 nm, 70 nm, 80 nm, 90 nm, 100 nm, 110 nm or 120 nm. For example, the second electrode includes a second metal conductive layer. The material of the second electrode 104 includes silver, magnesium, aluminum, lithium single metal, magnesium aluminum alloy (MgAl), lithium aluminum alloy (LiAl), and the like.

For example, a thickness of the second metal conductive layer is from 3 nm to 30 nm, for example, 5 nm, 10 nm, 15 nm, 20 nm, 25 nm or 30 nm. The auxiliary electrode is formed in a same layer as the gate electrode or the drain electrode, or formed in a same layer as at least two of the first electrode, the gate electrode and the drain electrode. For example, the auxiliary electrode is formed in a same layer as both the first electrode and the gate electrode; for example, the auxiliary electrode is formed in a same layer as both the first electrode and the drain electrode; for example, the auxiliary electrode is formed in a same layer as both the gate electrode and the drain electrode, and detailed descriptions will be omitted herein.

For example, the auxiliary electrode is a double-layer structure, and a first layer of the auxiliary electrode and the first electrode are prepared by a single mask plate and made of a same material; a second layer of the auxiliary electrode and the gate electrode are formed by a single mask plate and made of a same material.

For example, the auxiliary electrode is a double-layer structure, and a first layer of the auxiliary electrode and the first electrode are prepared by a single mask plate and made of a same material; a second layer of the auxiliary electrode and the drain electrode are formed by a single mask plate and made of a same material.

For example, the auxiliary electrode is a double-layer structure, and a first layer of the auxiliary electrode and the gate electrode are prepared by a single mask plate and made of a same material; a second layer of the auxiliary electrode and the drain electrode are formed by a single mask plate and made of a same material.

For example, the auxiliary electrode is a triple-layer structure, a first layer of the auxiliary electrode and the first electrode are prepared by a single mask plate and made of a same material; a second layer of the auxiliary electrode and the gate electrode are prepared by a single mask and made of a same material; a third layer of the auxiliary electrode and the drain electrode are prepared by a single mask plate and made of a same material.

The organic light-emitting diode (OLED) array substrate, the method for manufacturing an organic light-emitting diode (OLED) array substrate and the display apparatus provided by the embodiment of the present disclosure have at least one of the following beneficial effects:

(1) the auxiliary electrode is disposed in a same layer as at least one of the first electrode, the gate electrode, and the drain electrode, and the auxiliary electrode is formed in a case that the first electrode, the gate electrode and/or the drain electrode of the OLED array substrate is formed, which saves the process steps.

(2) the auxiliary electrode is connected in parallel with the second electrode through the plurality of via holes to reduce the resistance of the second electrode without increasing the process steps.

(3) the material of the auxiliary electrode may include a double-layer stacked structure of a metal conductive material and a transparent conductive material, if the auxiliary electrode is extended and blocks the driving transistor and the switching transistor, it is possible to prevent external light from irradiating on the driving transistor and the switching transistor, thereby a leakage current phenomenon is avoided.

The following points need to be explained:

(1) The drawings of the embodiments of the present disclosure are only related to the structures related to the embodiments of the present disclosure, and other structures can refer to general designs.

(2) For clarity, in the drawings for describing the embodiments of the present disclosure, a thickness of a layer or a thickness of a region is exaggerated or reduced, that is, these drawings are not drawn according to an actual scale. It should be understood that: in a case that an element such as a layer, a film, a region or a substrate is referred to as being disposed "on" or "beneath" another element, the element may be "directly" disposed "on" or "beneath" another element, or an intermediate element may be provided.

(3) In the absence of conflict, the embodiments of the present disclosure and the features in the embodiments can be combined with each other to obtain new embodiments.

What is described above is related to the illustrative embodiments of the disclosure only and not limitative to the scope of the disclosure. Therefore, the scopes of the disclosure are defined by the accompanying claims.

The present application claims the priority of the Chinese Patent Application No. 201710043335.5 filed on Jan. 19, 2017, the entirety of which is incorporated herein by reference as a part of the present application.

What is claimed is:

1. An organic light-emitting diode (OLED) array substrate, comprising:
  a base substrate;
  a driving transistor, a first electrode, a second electrode, an organic material functional layer, and an auxiliary electrode connected to the second electrode, all of which are disposed on the base substrate; wherein
  the organic material functional layer is located between the first electrode and the second electrode;
  the driving transistor comprises a gate electrode, a source electrode and a drain electrode, and the first electrode is electrically connected with the source electrode or the drain electrode;
  the auxiliary electrode is disposed in a same layer as the first electrode;
  the OLED array substrate further comprising a light-blocking component, wherein the light-blocking component and the first electrode are arranged in a same layer and made of a same material, and the light-blocking component and the auxiliary electrode are an integral structure;
  the auxiliary electrode comprises a first auxiliary electrode and a second auxiliary electrode, the light-blocking component is reused as the first auxiliary electrode, and the light-blocking component and the second auxiliary electrode spaced apart from the light-blocking component are electrically connected only through the second electrode; and
  an orthogonal projection of the light-blocking component on the base substrate is overlapped with an orthographic projection of the driving transistor on the base substrate.

2. The OLED array substrate according to claim 1, wherein the auxiliary electrode is a double-layer structure, a first layer of the auxiliary electrode is disposed in a same layer as the first electrode, and a second layer of the auxiliary electrode is disposed in a same layer as the gate electrode.

3. The OLED array substrate according to claim 1, wherein the auxiliary electrode is a double-layer structure, a first layer of the auxiliary electrode is disposed in a same layer as the first electrode, and a second layer of the auxiliary electrode is disposed in a same layer as the drain electrode.

4. The OLED array substrate according to claim 1, wherein the auxiliary electrode is a double-layer structure, a first layer of the auxiliary electrode is disposed in a same layer as the gate electrode, and a second layer of the auxiliary electrode is disposed in a same layer as the drain electrode.

5. The OLED array substrate according to claim 1, wherein the auxiliary electrode is a triple-layer structure, a first layer of the auxiliary electrode is disposed in a same layer as the first electrode, a second layer of the auxiliary electrode is disposed in a same layer as the gate electrode, and a third layer of the auxiliary electrode is disposed in a same layer as the drain electrode.

6. The OLED array substrate according to claim 1, further comprising an insulating structure disposed between the second electrode and the auxiliary electrode, wherein a plurality of via holes are disposed in the insulating structure, and the second electrode is connected to the auxiliary electrode through the plurality of via holes.

7. The OLED array substrate according to claim 6, wherein an orthographic projection of the second electrode on the base substrate is at least partially overlapped with an orthographic projection of the auxiliary electrode on the base substrate.

8. The OLED array substrate according to claim 7, wherein the first electrode comprises a first metal conductive layer, a transparent conductive layer or a stacked structure of the first metal conductive layer and the transparent conductive layer, and the second electrode comprises a second metal conductive layer.

9. The OLED array substrate according to claim 8, wherein a thickness of the first metal conductive layer is from 40 nm to 120 nm, a thickness of the second metal conductive layer is from 3 nm to 30 nm.

10. The OLED array substrate according to claim 1, further comprising a switching transistor, wherein an orthogonal projection of the light-blocking component on the base substrate is overlapped with an orthographic projection of the switching transistor on the base substrate.

11. A display apparatus, comprising the OLED array substrate according to claim 1.

12. A method for manufacturing an organic light-emitting diode (OLED) array substrate, comprising:
providing a base substrate;
forming a driving transistor, a first electrode, an organic material functional layer, a second electrode and an auxiliary electrode on the base substrate; wherein
the organic material functional layer is formed between the first electrode and the second electrode;
the driving transistor comprises a gate electrode, a source electrode and a drain electrode, and the first electrode is electrically connected to the source electrode or the drain electrode;
the auxiliary electrode is formed in a same patterning process and arranged at a same layer as the first electrode, and the auxiliary electrode is connected to the second electrode;
the manufacturing method further comprising forming a light-blocking component, wherein the light-blocking component and the first electrode are arranged in a same layer and made of a same material, and the light-blocking component and the auxiliary electrode are an integral structure;
the auxiliary electrode comprises a first auxiliary electrode and a second auxiliary electrode, the light-blocking component is reused as the first auxiliary electrode, and the light-blocking component and the second auxiliary electrode spaced apart from the light-blocking component are electrically connected only through the second electrode; and
an orthogonal projection of the light-blocking component on the base substrate is overlapped with an orthographic projection of the driving transistor on the base substrate.

13. The manufacturing method according to claim 12, wherein the auxiliary electrode is a double-layer structure, a first layer of the auxiliary electrode and the first electrode are prepared by a single mask plate and made of a same material; a second layer of the auxiliary electrode and the gate electrode are formed by a single mask plate and made of a same material.

14. The manufacturing method according to claim 12, wherein the auxiliary electrode is a double-layer structure, a first layer of the auxiliary electrode and the first electrode are prepared by a single mask plate and made of a same material; a second layer of the auxiliary electrode and the drain electrode are formed by a single mask plate and made of a same material.

15. The manufacturing method according to claim 12, wherein the auxiliary electrode is a double-layer structure, a first layer of the auxiliary electrode and the gate electrode are prepared by a single mask plate and made of a same material; a second layer of the auxiliary electrode and the drain electrode are formed by a single mask plate and made of a same material.

16. The manufacturing method according to claim 12, wherein the auxiliary electrode is a triple-layer structure, a first layer of the auxiliary electrode and the first electrode are prepared by a single mask plate and made of a same material; a second layer of the auxiliary electrode and the gate electrode are prepared by a single mask and made of a same material; a third layer of the auxiliary electrode and the drain electrode are prepared by a single mask plate and made of a same material.

17. The manufacturing method according to claim 12, further comprising forming an insulating structure between the second electrode and the auxiliary electrode; forming a plurality of via holes in the insulating structure; wherein the second electrode is connected to the auxiliary electrode through the plurality of via holes.

18. The manufacturing method according to claim 17, wherein the first electrode comprises a first metal conductive layer, a transparent conductive layer or a stacked structure of the first metal conductive layer and the transparent conductive layer, and the second electrode comprises a second metal conductive layer.

* * * * *